United States Patent
Kim

(10) Patent No.: US 8,736,314 B2
(45) Date of Patent: May 27, 2014

(54) LEAKAGE POWER MANAGEMENT USING PROGRAMMABLE POWER GATING TRANSISTORS AND ON-CHIP AGING AND TEMPERATURE TRACKING CIRCUIT

(75) Inventor: Nam Sung Kim, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 203 days.

(21) Appl. No.: 13/053,374

(22) Filed: Mar. 22, 2011

(65) Prior Publication Data

US 2012/0242392 A1 Sep. 27, 2012

(51) Int. Cl.
*H03K 3/00* (2006.01)

(52) U.S. Cl.
USPC ............................... 327/108; 327/544; 327/87

(58) Field of Classification Search
USPC ..................... 327/108, 544; 326/87
See application file for complete search history.

(56) References Cited

U.S. PATENT DOCUMENTS

| | | | | |
|---|---|---|---|---|
| 5,451,896 | A * | 9/1995 | Mori | 327/543 |
| 6,768,351 | B1 * | 7/2004 | Davis | 327/108 |
| 7,218,145 | B2 * | 5/2007 | Nunokawa | 326/68 |
| 7,336,117 | B2 * | 2/2008 | La Malfa et al. | 327/333 |

OTHER PUBLICATIONS

Kim, Nam Sung, et al., Frequency and Yield Optimization Using Power Gates in Power-Constrained Designs, pp. 121-126, IEEE ISPLED '09, Aug. 19-21, 2009, IEEE, Piscataway, NJ, USA.

Kim, Chan-Kyung, et al., CMOS Temperature Sensor with Ring Oscillator for Mobile DRAM Self-Refresh Control, pp. 1042-1049, Microelectrics Journal 38 (2007), Elsevier, Amsterdam, The Netherlands.

Kim, Tae-Hyoung, et al., Silicon Odometer: An On-Chip Reliability Monitor for Measuring Frequency Degradation of Digital Circuits, pp. 874-880, vol. 43, No. 4, Apr. 2008, IEEE Journal of Solid-State Circuits, IEEE, Piscataway, NJ, USA.

Zhen Ji, Christopher L. Brace; Expanded modeling of temperature-dependent dielectric properties for microwave thermal ablation; IOPscience web site; 2011 Institute of Physics and Engineering in Medicine; pp. 5249-5265; Printed in the UK.

Kazuyuki Saito. Koichi Ito, Preliminary Study of Coagulation Monitoring by Antenna for Treatment during Microwave Coagulation Therapy; The Open Biomedical Engineering Journal, 4, 13-15.

Peng Wang et al; Tumor Boundary Estimation Through Time-Domain Peaks Monitoring: Numerical Predictions and Experimental Results in Tissue-Mimicking Phantoms; IEEE Transactions on Biomedical Engineering, vol. 56, No. 11, Nov. 2009; pp. 2634-2641.

Peng Wang et al.; Tissue Dielectric Measurement Using an Interstitial Dipole Antenna; IEEE Transactions on Biomedical Engineering, vol. 59, No. 1, Jan. 2012; pp. 115-121.

* cited by examiner

*Primary Examiner* — Kenneth B. Wells

(74) *Attorney, Agent, or Firm* — Boyle Fredrickson, S.C.

(57) ABSTRACT

The number of power-gating transistors on an integrated circuit used for power reduction in a sleep mode is controlled during a wake state to adjust the current flow and hence voltage drop across the power-gating transistors as a function of aging of these transistors and/or a function of temperature of the integrated circuit. In this way, the supply voltage to the integrated circuit may be better tailored to minimize current leakage when the integrated circuit is young or operating at low temperatures.

28 Claims, 3 Drawing Sheets

LEAKAGE POWER MANAGEMENT USING PROGRAMMABLE POWER GATING TRANSISTORS AND ON-CHIP AGING AND TEMPERATURE TRACKING CIRCUIT

BACKGROUND OF THE INVENTION

The present invention relates to architectures for integrated circuits and in particular to a method and apparatus for managing transistor leakage currents in high-density integrated circuits such as microprocessors and the like.

Managing the power consumption of integrated circuits such as microprocessors is important for the purposes of energy conservation, providing improved battery life for portable devices, and reducing problems of device cooling.

One method of reducing power consumption is to place the integrated circuit in a "sleep state" when its full capabilities are not required. The sleep state may be implemented through a set of power gating transistors placed between the input power terminal (VDD) of the integrated circuit and an effective power terminal (VVDD) of the of the integrated circuitry that will be shut down to conserve power. A sleep/wake signal (generated externally or internally) turns these power gating transistors off or on.

Normally, the power gating transistors are implemented as multiple transistors connected in parallel in order to provide sufficient current flow for the anticipated maximum current consumption of the integrated circuit with a low voltage drop.

SUMMARY OF THE INVENTION

The present inventor has recognized that substantial power is wasted because of the need to oversize the power gating transistors for worst-case power consumption of the integrated circuit and anticipated weakening of the power gating transistors over time. This power is not wasted in the power gating transistors themselves so much as in the effects of the oversized power gating transistors on leakage currents in the remaining circuitry being controlled. Two mechanisms are at work.

First, the power gating transistors must be sized to accommodate high leakage currents when the circuit is at high operating temperatures. Because such power gating transistors approximate constant current sources, as the temperature of the integrated circuit drops and leakage current would be expected to decrease, the constant current operation of the power gating transistors increases the voltage on the integrated circuit, undoing some of the expected drop in leakage current, and thereby decreasing the possible power savings when the integrated circuit is operating at lower temperatures.

Second, the power gating transistors must be sized to accommodate their decreased current output over time (as a result of negative bias temperature instability). As a result, the integrated circuit operates at higher voltages than necessary during the first few years of operation with a corresponding increase in current leakage of the controlled circuitry.

Generally, the present invention addresses these problems by changing the number of active power gating transistors as a function of usage-time and temperature to decrease leakage current when the power gating transistors are in the on or wake state.

One embodiment of the invention provides an integrated circuit having an input terminal receiving electrical power for the integrated circuit. Multiple power gating transistors are connected in parallel between the input terminal and integrated circuitry implementing a function of the integrated circuit, the power gating transistors selectively controlling power to the integrated circuitry according to a sleep/wake signal used for power conservation. A transistor aging detector generates a signal reflecting an aging of the power gating transistors, the signal controlling the power gating transistors to compensate for a decrease in power gating transistor current flow as a function of transistor control voltage as the power gating transistors age. As used herein, "aging" refers to use-induced degradation in current flow through the on state transistor.

It is thus a feature of at least one embodiment of the invention to decrease unnecessary leakage current early in the life of an integrated circuit by avoiding the need to oversize the power gating transistors in order to accommodate end-of-life-cycle degradation in these transistors.

The power gating transistors may have different control inputs connected to the sleep/wake signal and the transistor aging detector may increase the number of control inputs connected to the sleep/wake signal as the power gating transistors age.

It is thus a feature of at least one embodiment of the invention to provide a method of controlling voltage drop employing digital switching techniques readily implemented on an integrated circuit.

The power gating transistors may provide different effective conductive widths. For example, the different effective conductive widths of the transistor groups may follow an exponentially increasing relationship.

It is thus a feature of at least one embodiment of the invention to permit fine resolution control of circuit voltage by switching different combinations of transistors on and off, not simply changing the total number of transistors switched on.

The transistor aging detector may provide two similar circuits, one operating when at least some power gating transistors are turned on according to the sleep/wake signal. The transistor aging detector compares performance of the two similar circuits to detect transistor aging.

It is thus a feature of at least one embodiment of the invention to provide a method of determining aging over the span of many years under the assumption that there will be variation in transistor aging among different devices. By comparing two actual circuits (as opposed, for example, to using a timer) a closer approximation of age-related transistor degradation may be obtained.

The second circuit may operate only during a periodic predetermined time interval when the transistor aging detector is making a measurement of transistor aging, the periodic predetermined time interval averaging less than an average time when the power gating transistors are on.

It is thus a feature of at least one embodiment of the invention to provide a benchmark circuit that approximates transistor performance free of aging.

The two similar circuits may be oscillators responsive to transistor switching speed.

It is thus a feature of at least one embodiment of the invention to provide a simple method of detecting the aging process as is reflected in the speed of oscillator.

The oscillators may be chains of at least ten series connected inverters.

It is thus a feature of at least one embodiment of the invention to provide a structure that may provide a desired sensitivity to aging simply by the addition of simple inverter circuits.

The transistor aging detector may include a counter to count cycles of each of the oscillators for a period of time and use a difference between counted cycles of each oscillator as a measure of transistor aging.

It is thus a feature of at least one embodiment of the invention to provide a simple quantification of the aging process using a counter counting oscillations.

At least one of the oscillators may include switchably connected tuning elements allowing adjustment of a frequency of the oscillator at a given aging of the power gating transistors.

It is thus a feature of at least one embodiment of the invention to permit "tuning" of the oscillator to a particular frequency to eliminate the effect of process induced variations on accuracy of the aging detection.

The circuit of the transistor aging detector may include transistors positioned proximate to the power gating transistors and of comparable architecture to the power gating transistors.

It is thus a feature of at least one embodiment of the invention to provide similar thermal environments and structures for the power gating transistors and the aging detector for accurate aging assessment.

The integrated circuit may be a synchronous circuit coordinating operation of different components according to a clock signal.

It is thus a feature of at least one embodiment of the invention to provide reduced power consumption in clocked circuits that are highly sensitive to minimum voltage.

An alternative or additional embodiment of the invention may provide a temperature detector detecting an operating temperature of the integrated circuitry for controllably decreasing the current flow through the power gating transistors as the temperature of the integrated circuitry decreases.

It is thus a feature of at least one embodiment of the invention to fully realize the power savings expected for low temperature operation by reducing an increase in the operating voltage of the circuitry as would ordinarily occur under decreased current demand using a power source providing constant current operation.

The temperature detector may provide at least one oscillator having a frequency which is temperature sensitive and may compare this frequency to a frequency of a second oscillator having a different temperature sensitivity.

It is thus a feature of at least one embodiment of the invention to provide a simple temperature sensor employing standard circuit elements.

The second oscillator may be an external clock signal.

It is thus a feature of at least one embodiment of the invention to exploit the external clock source (often a crystal oscillator) to provide for the desired different temperature sensitivities in the two oscillators.

The second oscillator may be a ring oscillator of at least ten series connected inverters.

It is thus a feature of at least one embodiment of the invention to provide a circuit that may be easily adjusted in sensitivity by adding inverter elements.

The inverters may be current starved inverters providing reduced sensitivity to operating voltage and the current starved inverters may be attached to electrical power unswitched by the power gating transistors.

It is thus a feature of at least one embodiment of the invention to provide temperature sensing with reduced sensitivity to supply voltage.

The temperature detector may include a counter to count cycles of each of the oscillators for a period of time and may use a difference between counted cycles of each oscillator as a measure of temperature.

It is thus a feature of at least one embodiment of the invention to provide a simple method of quantifying a temperature signal for control of the power gating transistors.

The first oscillator may include switchably connected tuning elements allowing adjustment of a frequency of the oscillator at a given temperature of the power gating transistors.

It is thus a feature of at least one embodiment of the invention to permit accurate temperature tuning of the device despite process variations.

These particular features and advantages may apply to only some embodiments falling within the claims and thus do not define the scope of the invention.

DETAILED DESCRIPTION OF THE PREFERRED EMBODIMENT

Figure 1:
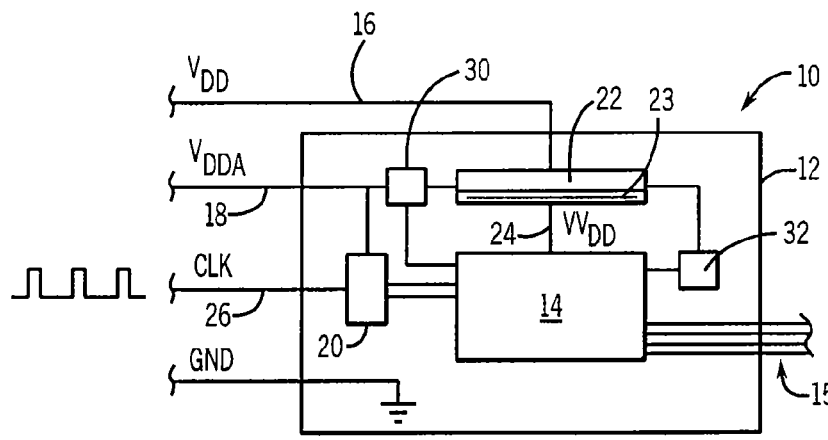
FIG. 1 is a simplified block diagram of an integrated circuit showing power gating transistors controlling power to other circuit elements and blocks providing aging and temperature-based control elements for controlling the power gating transistors when in the wake state.

Referring now to FIG. 1, an integrated circuit 10 may provide a substrate 12 having application circuitry 14 implementing the primary function of the integrated circuit 10. The application circuitry 14 may be, for example, microprocessor circuitry, digital signal processing circuitry, FPGA circuitry and the like and typically communicates with other devices and components via one or more input/output lines 15. The application circuitry 14 may be constructed on the substrate 12 according to standard lithography techniques and include components such as resistors, capacitors, and transistors including but not limited to PMOS and NMOS type transistor devices.

The integrated circuit 10 may receive external power supplies 16 ($V_{DD}$) and 18 ($V_{DDA}$). The power supply 16 may provide, for example, power to the application circuitry 14 while the power supply 18 may provide an analog reference voltage, for example, to a phase lock loop 20 used to synthesize clock signals on the integrated circuit 10.

Power supply 16 may be received by power-gating transistor array 22 of a type known in the art providing switched current control to at least portions of the application circuitry 14 according to a sleep/wake signal (not shown in FIG. 1) that may be generated externally or internally by the application circuitry 14 and according to values of control register 23 controlling individual or groups of the transistors of the power-gating transistor array 22.

The output of the power-gating transistor array 22 provides an internal voltage source 24 ($VV_{DD}$) that provides power to the switched portions of the application circuitry 14. It will be understood therefore that the sleep/wake signal may be used to turn $VV_{DD}$ on or off to conserve power. Because the transistors of the power-gating transistor array 22 are generally integrated on the substrate 12 they may respond more rapidly than an external voltage regulator.

The integrated circuit 10 may further receive a clock signal from an external system clock 26, for example, at the phase lock loop 20, the latter which may synthesize different clock frequencies used to synchronize operation of all or portions of the application circuitry 14. Generally, the external clock signal is provided by a high accuracy crystal oscillator or the like that is relatively temperature insensitive. In any case the external clock signal is generally thermally separate from circuitry on the substrate 12 of the integrated circuit 10.

In addition to the application circuitry 14 and the power-gating transistor array 22, the present invention provides transistor-aging-compensation circuit 30. The transistor-aging-compensation circuit 30 communicates with the power-gating transistor array 22 through control registers 23 as will be described and also optionally communicates with application circuitry 14 for various timing signals. As will be described below, the transistor-aging-compensation circuit 30 provides a signal reflecting aging of the transistors of the power-gating transistor array 22 for controlling the transistors of the power-gating transistor array 22 in accordance with that signal.

In addition the present invention provides a temperature-compensation circuit 32 also communicating with the transistors of the power-gating transistor array 22 through their control registers and optionally communicating with the application circuitry 14 for various timing signals. As will be discussed below, the temperature-compensation circuit 32 provides a signal indicating a temperature of the application circuitry 14 and controlling the transistors of the power-gating transistor array 22 in accordance with that signal.

Figure 2:
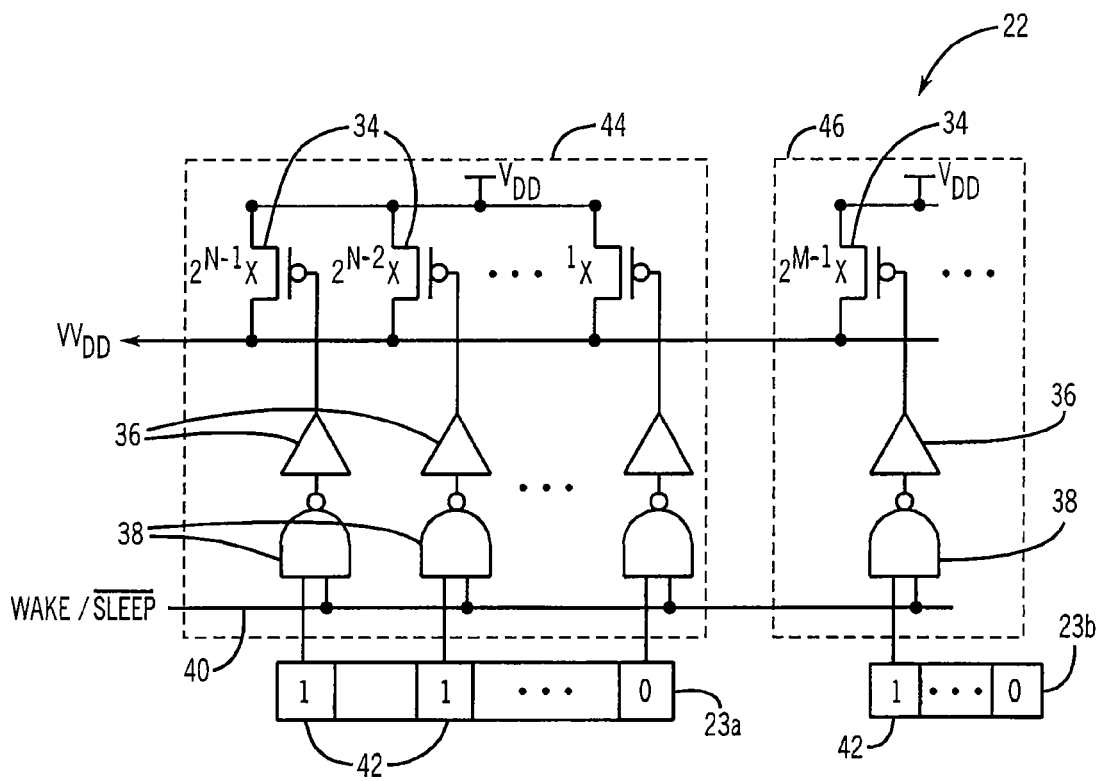
FIG. 2 is a schematic diagram of the power gating transistors of FIG. 1 having individual control inputs controlled by control registers.

Referring now to FIG. 2, the power-gating transistor array 22 may provide multiple transistors 34 acting as switches with the sources and drains of transistors 34 connected in parallel between $V_{DD}$ and $VV_{DD}$.

Each of the transistors 34 may have a gate connected via a buffer 36 to dual-input NAND gate 38 having one input shared among all NAND gates 38 and connected to the sleep/wake signal 40. In this manner, the sleep/wake signal 40 may be used to turn off all of the transistors 34 (through a logical false value) when the application circuitry 14 goes into sleep mode.

The other input of each NAND gate 38 connects to different bits 42 of a control register 23a or 23b so that individual transistors 34 may be controlled by single bits in the control registers 23a or 23b. As will be discussed below, the bits of the control register 23a and 23b may be set and reset by the temperature-compensation circuit 32 and transistor-aging-compensation circuit 30, respectively, as will be described.

Transistors 34 approximate voltage controlled current sources and, therefore, the voltage drop across the transistors 34 (for a given current load by the application circuitry 14) may be controlled by changing the number of transistors 34 that are switched on and the number switches that are switched off via bits of the control registers 23. In this way, the voltage $VV_{DD}$ applied to each of the application circuitry 14 may be separately controlled through the transistor-aging-compensation circuit 30 and temperature-compensation circuit 32 by adjusting the settings of the register 23.

While each of the transistors 34 may have an equal weighting with respect to determining the voltage drop across the switches, in a preferred embodiment, the effective conductive widths of the transistors 34 are varied, for example, in an exponential fashion (e.g., by powers of two) so that a larger number of different discrete voltage levels may be obtained. In this latter scheme, for example, eight transistors controlled by eight bits 42 can obtain 256 different currents and hence voltage drop levels.

In one embodiment of the present invention the transistors 34 may be separated into a first and second group 44 and 46 each associated with a different one of the registers 23a and 23b with the first group 44 being controlled by the temperature-compensation circuit 32 and the second group being controlled by the transistor-aging-compensation circuit 30.

Figure 3:
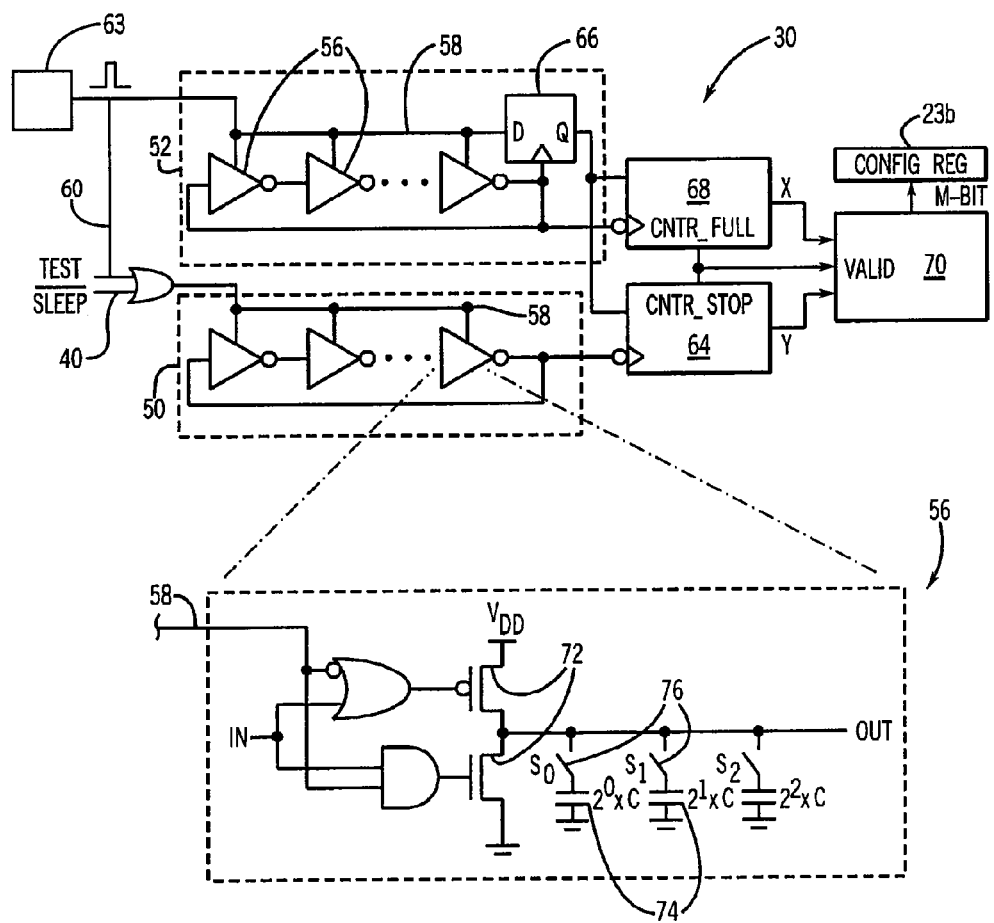
FIG. 3 is a schematic diagram of the age-based control elements of FIG. 1 with a detail of one inverter of that control element.

Referring now to FIG. 3, as noted, the transistor-aging-compensation circuit 30 may control the configuration register 23b so as to generally increase the number of transistors 34 turned on during the wake mode as the switching transistors 34 age. Generally, this aging decreases the current flow through each transistor 34 for a given gate voltage, increasing the voltage drop across the power-gating transistor array 22 for a given current load. By being able to change the number of transistors 34 turned on as a function of age, fewer transistors may be turned on during the early life of the integrated circuit 10. This has the result of decreasing the value of $VV_{DD}$ early in the life of the integrated circuit and therefore of decreasing the leakage current and thus its power consumption of the application circuitry 14. Without the transistor-aging-compensation circuit 30, a constant number of transistors 34 would have to be turned on during the wake cycle resulting in excess $VV_{DD}$ early in the life of the device.

Referring now to FIG. 3, the transistor-aging-compensation circuit 30 may provide two circuits 50 and 52 which generally will be affected by aging in the same manner as the transistors 34. Circuit 50 will be activated whenever the transistors 34 are on in the wake state and thus will generally age with those transistors 34. Circuit 52, which may otherwise be substantially identical circuit 50, will be turned on only briefly when a test of aging needs to be performed. This period of time is minimized so as to substantially represent an un-aged circuit. The operation of two circuits is then compared to provide an age signal reflecting aging of the switching transistors 34 with use. The periodic activation of circuits 50 and 52 may be performed by separate timer structure or by the the application circuitry 14.

In one embodiment, circuits 50 and 52 may be composed of ring oscillators formed from inverters 56 connected in a ring with the output of one inverter connected to the input of the next inverter in the ring. As is understood in the art, an odd number of inverters connected in a ring will produce an oscillating signal whose frequency is proportional largely to the switching speed of the inverters 56. In one embodiment one-hundred and five inverters 56 are used to provide the desired sensitivity to aging.

Enable lines 58 for the circuit 50 are activated during the wake state indicated by the sleep/wake signal 40 and when an aging test signal 60 is periodically produced by a timer 63 or the like. In contrast the enable line 58 of the circuit 52 is activated only by the aging test signal 60.

When the transistors 34 of the power-gating transistor array 22 are activated, the circuit 50 will oscillate. The output of the circuit 50 is received by a first counter 64, but the count value of this counter 64 is ignored at this time.

When the aging test signal 60 is activated both circuits 50 and 52 begin oscillating. Circuit 52 provides a flip-flop 66 that is clocked by a first output from the oscillator of the circuit 52 to sample the enable lines 58 of the circuit 52. The resulting output of the flip-flop 62 is used to reset first counter 64 and second counter 68, the latter receiving the output from the oscillator of circuit 52. When second counter 68 saturates (without overflowing), a saturation output connected to first counter 64 causes first counter 64 to stop its counting.

Generally, the oscillator of circuit 52 will be faster than the oscillator circuit 50 because it has experienced less aging. Accordingly the value in second counter 68 will be larger than the value in counter 64 when both counters stop. The output of both counters are provided to a comparator 70 whose difference may be used to provide data to the configuration register 23b. This comparison process is also triggered by the saturation output of second counter 68.

The difference value from the comparator 70 provides an aging signal. Generally, as indicated above, when the difference between the output of counter 68 and 64 is larger, such as indicates a greater aging of transistors 34, the aging signal will load a higher value into the configuration register which will result in greater number of transistors 34 being activated. This process may simply map the difference from comparator 70 to the configuration register 23b as scaled or offset by simple arithmetic operations. Preferably, the mapping of the output of comparator 70 is calibrated so that less than all of the transistors 34 in group 46 are turned on at the beginning of operation of the integrated circuit 10 and after approximately seven years or some other suitable predetermined lifetime all of the available transistors 34 in group 46 will be turned on. This calibration factor can be made according to a value in a one-time programmable register (not shown) that may be set at the time of manufacture.

Referring still to FIG. 3, each of the inverters 56 may be constructed so that its inverter output transistors 72 are both turned off when the enable line 58 is low and the switching transistors 34 are off and the aging test is not being performed. These output transistors 72 are the principal determinant of the speed of the oscillators of circuits 50 and 52. The output of the inverter 56 may be loaded with one or more capacitors 74 activated by switches 76 controlled by a one-time programmable register (fuses) so as to match the frequency of both circuits 50 and 52 at the manufacture date of the integrated circuit 10. It will be understood that these capacitors 74 operate to effectively slow the rise time of the output of the inverter 56. The capacitors 74 may be arranged to have magnitudes that are exponentially related (for example in powers of two) to provide for many different capacitance values with different combinations of switching according to a binary sequence. Thus three capacitors shown can provide $2^3$ different capacitance values for fine control.

Both of the circuits 50 and 52 are placed near each other so as to track any thermal effects and ideally placed near the switching transistors 34 for the same reason.

Figure 4:
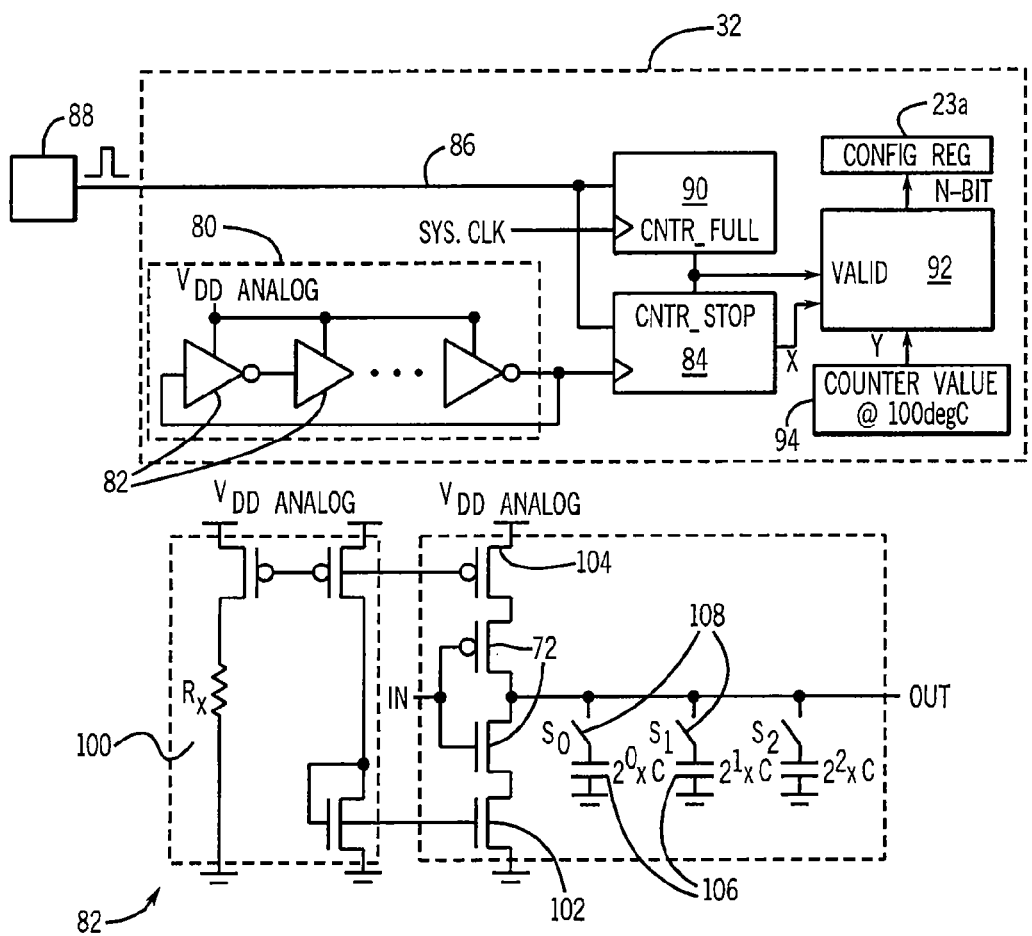
FIG. 4 is a schematic diagram of the temperature-based control element of FIG. 1 with a detail of one inverter of that circuit.

Referring now to FIG. 4, the temperature-compensation circuit 32 may also provide a ring oscillator 80 comprised of inverters 82 connected input to output in a ring. The ring oscillator 80 provides a clock signal to a first counter 84. In one embodiment thirty-three inverters 82 are used.

A temperature test signal 86, which may be periodically generated by a counter 88, resets then enables both the counter 84 connected to the oscillator 80 and a second counter 90. The second counter 90 receives a clock signal derived from the system clock 26 (typically through the phase lock loop 20) and thus operates at a counting frequency that is largely unrelated to the temperature of the application circuitry 14. In contrast the oscillator 80 is placed near the application circuitry 14 to be influenced by the latter's temperature.

As before, when counter 90 saturates (without overflowing), its saturation output is connected to counter 84 to stop counter 84, and connected to comparison circuit 92 to cause a comparison circuit 92 to read the output of counter 84 and compare it with a stored value 94 representing, for example, an unexpected counter value for counter 84 (for the time of counting determined by counter 90) when the application circuitry 14 is operating at 100° C. A comparison between the counter value for counter 84 and the stored value 94 is mapped (with suitable offset and scaling) to the configuration register 23a to control transistors 34 in group 44.

Ideally, the comparison circuit 92 is calibrated to decrease the number of switching transistors 34 that turn on during the wake state (indicated by the sleep/wake signal 40) as the temperature of the application circuitry 14 falls (and the oscillator 80 runs slower). In this way, the decreased current load presented by cooler application circuitry 14 does not cause an increase in the supply voltage $VV_{DD}$ delivered to the power transistors 34 as would otherwise occur as a result of their substantially constant current outputs. The calibration of the comparison circuit 92 may be set at the time of manufacture, for example, using a one-time programmable register.

In order to make the inverters less sensitive to voltage fluctuations in $V_{DD}$, the temperature-compensation circuit 32 may be powered from the analog power supply 18 described above. Power supply 18 tends to be de-correlated from the principal power consumption of the application circuitry 14. Nevertheless, the principal features of the present invention may be implemented with a single power supply 16.

In addition, the design of the inverters 82 may be current starved by means of bias circuit 100 controlling the current through throttling transistors 102 and 104 that flank the output transistors 72 of the inverter. As described above with respect to the circuit of FIG. 4, capacitors 106 may be switched by switches 108 controlled by a programmable register (not shown) to shunt the output of the inverters 82 thereby permitting adjustment of the tuning of the oscillator 80 to a particular frequency at a particular temperature. The current starved design is described, for example, in C-K Kim et al. "CMOS temperature sensor with ring oscillator for mobile DRAM self-refresh control", Microelectronics Journal, vol. 38, pp. 1042-1049, October 2007, hereby incorporated by reference.

It will be recognized that, in an alternative embodiment, one or both of the sensing of transistor aging or temperature may be done by monitoring the value of $VV_{DD}$ to detect changes in voltages reflecting aging of the power gating transistors and/or changes in operating temperature of the integrated circuit. Such monitoring may be used to stabilize the value of $VV_{DD}$ to prevent the undesired additional leakage currents addressed by the present invention. This monitoring will monitor a filtered version of $VV_{DD}$ to remove high frequency AC components of the $VV_{DD}$ signal using techniques well known in the art, to eliminate the influence of short-term power fluctuations. This approach has some drawbacks with respect to the above described embodiments including the difficulties of providing on-chip voltage sensors and accurate voltage references and the fact that $VV_{DD}$ fluctuates rapidly and thus temperature or transistor aging detection requires a filtering mechanism to provide an accurate reading and long term statistics. In addition $VV_{DD}$ varies across the substrate which would require multiple sensors.

It is specifically intended that the present invention not be limited to the embodiments and illustrations contained herein and the claims should be understood to include modified forms of those embodiments, including portions of the embodiments and combinations of elements of different embodiments as come within the scope of the following claims.

I claim:
1. An integrated circuit comprising:
an input terminal receiving an electrical power supply for the integrated circuit, the electrical power supply providing electrical power not adapted to convey data;
integrated circuitry including multiple transistors implementing a function of the integrated circuit, wherein the integrated circuitry is adapted to communicate electrical signals conveying data externally from the integrated circuit via one or more input/output signal lines;

multiple power-gating transistors connected in parallel between the input terminal and an effective power terminal of the integrated circuitry for controlling an internal voltage source delivering power to the integrated circuitry that is not adapted to convey data according to a sleep/wake signal used for power conservation, wherein the power-gating transistors provide power for the integrated circuitry when in the wake state, and wherein the effective power terminal comprises a common connection of multiple non-gate transistor terminals of the integrated circuitry; and a transistor-aging detector generating a signal reflecting an aging of the power-gating transistors, the signal controlling the power-gating transistors to compensate for a decrease in power-gating transistor current flow as a function of transistor control voltage as the power-gating transistors age.

2. The integrated circuit of claim 1 wherein the power-gating transistors have different control inputs connected to the sleep/wake signal and the transistor-aging detector increases a number of control inputs connected to the sleep/wake signal as the power-gating transistors age.

3. The integrated circuit of claim 2 wherein the power-gating transistors having different control inputs providing different effective conductive widths.

4. The integrated circuit of claim 3 wherein the different effective conductive widths follow an exponentially increasing relationship.

5. The integrated circuit of claim 1 wherein the transistor-aging detector provides two similar circuits, one operating when at least some power-gating transistors are turned on according to the sleep/wake signal, wherein the transistor-aging detector compares performance of the two similar circuits to detect transistor aging.

6. The integrated circuit of claim 5 wherein the second circuit operates only during a periodic predetermined time interval when the transistor-aging detector is making a measurement of transistor aging, the periodic predetermined time interval averaging less than an average time when the power-gating transistors are on.

7. The integrated circuit of claim 5 wherein the two similar circuits are oscillators responsive to transistor switching speed.

8. The integrated circuit of claim 7 wherein the oscillators are chains of at least ten series-connected inverters.

9. The integrated circuit of claim 7 wherein the transistor-aging detector includes a counter to count cycles of each of the oscillators for a period of time and uses a difference between counted cycles of each oscillator as a measure of transistor aging.

10. The integrated circuit of claim 7 wherein at least one of the oscillators includes switchably connected tuning elements allowing adjustment of a frequency of the oscillator at a given aging of the power-gating transistors.

11. The integrated circuit of claim 1 wherein the transistor-aging detector includes transistors positioned proximate to the power-gating transistors and of comparable architecture to the power-gating transistors.

12. The integrated circuit of claim 1 wherein the integrated circuitry is a synchronous circuit coordinating operation of different components according to a clock signal.

13. The integrated circuit of claim 12 wherein the integrated circuitry is a microprocessor for executing a sequential program.

14. The integrated circuit of claim 1 further including:
a temperature detector detecting an operating temperature of the integrated circuitry for controllably decreasing the current flow through the power-gating transistors as the temperature of the integrated circuitry decreases.

15. A method of operating an integrated circuit comprising the steps of:
(a) periodically gating an electrical power supply providing electrical power not adapted to convey data to an effective power terminal of circuitry of the integrated circuit using power gating-transistors on the integrated circuit according to a sleep/wake signal to provide power that is not adapted to convey data to the integrated circuit during a wake time indicated by the sleep/wake signal and to block power to the integrated circuit during a sleep time indicated by the sleep/wake signal, wherein the integrated circuitry is adapted to communicate electrical signals conveying data with other devices via one or more input/output signal lines during the wake time, and wherein the effective power terminal comprises a common connection of multiple non-gate transistor terminals of the circuitry of the integrated circuit;
(b) generating an aging signal reflecting a change in a gain of the power-gating transistors as a function of the wake time; and
(c) further controlling the power-gating transistors according to the aging signal to provide more constant current flow through the power-gating transistors during the wake time as the power-gating transistors age.

16. An integrated circuit comprising:
an input terminal receiving an electrical power supply for the integrated circuit, the electrical power supply providing electrical power not adapted to convey data;
integrated circuitry including multiple transistors implementing a function of the integrated circuit, wherein the integrated circuitry is adapted to communicate electrical signals conveying data externally from the intergrated circuit via one or more input/output signal lines;
multiple power gating transistors connected in parallel between the input terminal and an effective power terminal of the integrated circuitry for selectively blocking and providing power that is not adapted to convey data to the integrated circuitry according to a sleep/wake signal used for power conservation, wherein the power-gating transistors provide power for the integrated circuitry when in the wake state, and wherein the effective power terminal comprises a common connection of multiple non-gate transistor terminals of the integrated circuitry; and
a temperature detector detecting an operating temperature of the integrated circuitry for controllably decreasing a current flow through the power-gating transistors as the temperature of the integrated circuitry decreases.

17. The integrated circuit of claim 16 wherein the power-gating transistors have different control inputs connected to the sleep/wake signal and the temperature detector decreases a number of control inputs connected to the sleep/wake signal as the temperature of the integrated circuit decreases.

18. The integrated circuit of claim 16 wherein the power-gating transistors with different control inputs provide different effective conductive widths.

19. The integrated circuit of claim 18 wherein the different effective conductive widths of the transistor groups follow an exponentially increasing relationship.

20. The integrated circuit of claim 16 wherein the temperature detector includes a first oscillator having a frequency which is temperature sensitive and compares this frequency to the frequency of a second oscillator having a different temperature sensitivity.

21. The integrated circuit of claim 20 wherein the second oscillator is an external clock signal.

22. The integrated circuit of claim 20 wherein the first oscillator is a ring oscillator of at least 10 series-connected inverters.

23. The integrated circuit of claim 22 wherein the inverters are current-starved inverters providing reduced sensitivity to operating voltage and wherein the current-starved inverters are attached to electrical power switched on by the power-gating transistors.

24. The integrated circuit of claim 20 wherein the temperature detector includes a counter to count cycles of each of the oscillators for a period of time and uses a difference between counted cycles of each oscillator as a measure of temperature.

25. The integrated circuit of claim 21 wherein the first oscillator includes switchably connected tuning elements allowing adjustment of a frequency of the oscillator at a given temperature of the power gating transistors.

26. The integrated circuit of claim 16 wherein the integrated circuitry is a synchronous circuit coordinating operation of different components according to a clock signal.

27. The integrated circuit of claim 26 wherein the integrated circuitry is a microprocessor for executing a sequential program.

28. A method of operating an integrated circuit comprising the steps of:

(a) periodically gating an electrical power supply providing electrical power not adapted to convey data to an effective power terminal of circuitry of the integrated circuit using power-gating transistors on the integrated circuit according to a sleep/wake signal to provide power that is not adapted to convey data to the integrated circuit during a wake time indicated by the sleep/wake signal and to block power to the integrated circuit during a sleep time indicated by the sleep/wake signal, wherein the integrated circuitry is adapted to communicate electrical signals conveying data externally via one or more input/output signal lines during the wake time, and herein the effective power terminal comprises a common connection of multiple non-gate transistor terminals of the circuitry of the integrated circuit;

(b) generating a temperature signal reflecting a change in the temperature of the integrated circuit; and (c) further controlling the power-gating transistors according to the temperature signal to decrease a current flow through the power-gating transistors as the temperature of the integrated circuitry decreases.

* * * * *

UNITED STATES PATENT AND TRADEMARK OFFICE
CERTIFICATE OF CORRECTION

Page 1 of 1

PATENT NO. : 8,736,314 B2
APPLICATION NO. : 13/053374
DATED : May 27, 2014
INVENTOR(S) : Nam Sung Kim It is certified that error appears in the above-identified patent and that said Letters Patent is hereby corrected as shown below:

IN THE CLAIMS

CLAIM 28          Delete "herein" and substitute therefor
Col. 12, Line 16  -- wherein --

Signed and Sealed this
Seventh Day of October, 2014

Michelle K. Lee
*Deputy Director of the United States Patent and Trademark Office*